United States Patent [19]
Choi et al.

[11] Patent Number: 5,883,769
[45] Date of Patent: Mar. 16, 1999

[54] ALUMINUM HEAD DRUM WITH A PROTECTIVE LAYER WHICH SMOOTHLY AND CONTINUOUSLY VARIES IN HARDNESS FOR USE IN A VIDEOCASSETTE RECORDER

[75] Inventors: Kye-Chul Choi; Keum-Mo Kim; Kwang-Yong Eun; Kwang-Ryeol Lee, all of Seoul, Rep. of Korea

[73] Assignee: Daewoo Electronics Co., Ltd., Seoul, Rep. of Korea

[21] Appl. No.: 885,584

[22] Filed: Jun. 30, 1997

Related U.S. Application Data

[63] Continuation-in-part of Ser. No. 443,842, May 18, 1995, abandoned.
[51] Int. Cl.[6] .................................................. G11B 15/60
[52] U.S. Cl. ....................................................... 360/130.24
[58] Field of Search .............................. 360/84–85, 107, 360/130.22, 130.24

[56] References Cited

U.S. PATENT DOCUMENTS 5,291,957  3/1994  Curlett ........................................ 175/67
5,768,046  6/1998  Lee ....................................... 360/130.24

*Primary Examiner*—A. J. Heinz
*Attorney, Agent, or Firm*—Anderson, Kill & Olick, P.C.

[57] ABSTRACT

An aluminum head drum for use in a video cassette recorder is coated with a protective layer comprising diamond-like carbon. The protective layer of diamond-like carbon is obtained using a plasma-enhanced chemical vapor deposition method and has a thickness ranging from 0.3 $\mu$m to 2.0 $\mu$m. The protective layer has a varying mechanical hardness, wherein the mechanical hardness has a maximum value at a region of the protective layer coming in contact with the aluminum head drum, decreases smoothly and continuously and reaches an minimum value at a region of the protective layer coming in contact with atmosphere. Micro-Vicker's hardness of the region of the protective layers coming in contact with a video tape is 1.5–2.0 times that of the magnetic substance constituting the video tape.

4 Claims, 7 Drawing Sheets

ALUMINUM HEAD DRUM WITH A PROTECTIVE LAYER WHICH SMOOTHLY AND CONTINUOUSLY VARIES IN HARDNESS FOR USE IN A VIDEOCASSETTE RECORDER

This application is a continuation-in-part of U.S. Ser. No. 08/443,842 filed on May 18, 1995, and now abandoned.

FIELD OF THE INVENTION

The present invention relates to a video cassette recorder ("VCR"); and, more particularly, to an improved aluminum head drum for use in a VCR having a protective layer comprising either diamond-like carbon(DLC) coated thereon and a method for the forming the protective layer.

BACKGROUND OF THE INVENTION

As is well known, one of the primary roles of a head drum in a VCR is to provide stability to the magnetic tape travelling along a defined path within the VCR without damaging or adversely affecting the tape. In order to fulfill this role, the surface of the head drum which is in contact with the moving tape is designed in such a way that it has macroscopic smoothness and yet, microscopically, is provided on its surface with a plurality of undulations running along the direction normal to the rotational axis thereof in order to reduce the friction therebetween. Inasmuch as another design requirement thereof lies in the protection of the information recorded on the tape, the head drum is usually made of a non-magnetic material.

The head drum has been hitherto made primarily by die casting an aluminum alloy such as Al—Si, Al—Cu or a variation thereof. Above the surface of the head drum made by die casting such an aluminum alloy, there is formed a layer of aluminum oxide ($Al_2O_3$) in the thickness of a few nm, said layer being in physical contact and interacting with the lubricating and magnetic layer of the tape.

Since the layer of $Al_2O_3$ formed on the head drum surface is of an insufficient thickness, i.e., too thin, the mechanical properties of the $Al_2O_3$ layer will be largely influenced by the mechanical properties of the aluminum alloy constituting the aluminum head drum. In other words, the effect of the $Al_2O_3$ layer can be virtually ignored and the overall mechanical properties of the aluminum head drum surface can simply be regarded as those of the surface made of the aluminum alloy alone. The mechanical hardness, and hence the resistance to wear, of the aluminum head drum is further affected adversely by the presence of voids or pores therein during the die casting thereof.

During a normal operation of the VCR, since such magnetic powders having a needle-like shape in the magnetic layer as $\gamma\text{-}Fe_2O_3$, Fe and the like are mechanically harder than the aluminum alloy as shown in Table 2 hereof, the magnetic powders will, in addition to scratching and wearing down the aluminum head drum surface, become embedded on the aluminum head drum surface. Those embedded magnetic powders, in addition to scratching the tape surface, when accumulated in enough quantities, will form a layer on the surface of the aluminum head drum, which will in turn affect magnetically the information stored on the tape itself, thereby harming the quality of the picture.

Furthermore, since the aluminum head drum is designed by taking into consideration such factors as aerodynamic and adhesion properties between the aluminum head drum surface and the tape in order to provide stability to the traveling tape, even a slight wearing down of the aluminum head drum surface, for example in the neighborhood of 0.3 $\mu$m, may hamper the aluminum head drum from fulfilling the above-mentioned primary objective.

Furthermore, wearing down of the tips of the undulations provided on the head drum surface will increase the contact area between the tape and the aluminum head drum, which may further aggravate the wearing down process. If this process is allowed to continue, it will affect the performance of the VCR, causing sudden shaking of picture or stoppage thereof.

One of the methods that can be used in overcoming such a problem is to form a protective layer made of a material which is mechanically harder than the magnetic powders in the magnetic layer of the tape on the surface of the aluminum head drum coming in contact with the tape, as suggested by Shibano et al. in the Japanese Public Disclosure No. 209353/1992, entitled "Magnetic Recording/Reproducing Device" and by Takahashi in the Japanese Public Disclosure No. 126459/1992, entitled "Magnetic Recording Reproducing Drum". According to Shibano et al., it is possible to protect the surface of the aluminum head drum coming in contact with the tape by forming a first protective layer made of titanium(Ti) having a thickness of 0.1–0.3 $\mu$m followed by forming a second protective layer made of titanium nitride(TiN) having a thickness of 0.5–0.7 $\mu$m. On the other hand, Takahashi indicated that it is possible to solve the problem by forming a protective layer made of diamond-like carbon(DLC) on the surface of the aluminum head drum coming in contact with the tape. However, both approaches are burdened with a number of major shortcomings, one of the major shortcomings being that even though it is possible to protect the surface of the aluminum head drum using the approaches suggested by Shibano et al. and Takahashi, the protective layer made of Ti and TiN or DLC fails miserably in its ability to protect the tape itself. Since the material making up the protective layer is much harder mechanically than the magnetic material on the tape, the protective layer will adversely affect the physical integrity of the tape when it comes in contact with the tape, thereby harming the quality of the picture.

SUMMARY OF INVENTION

It is, therefore, a primary object of the present invention to provide an improved aluminum head drum for use in a VCR having a non-magnetic protective layer of a sufficient thickness and hardness coated on the aluminum head drum.

It is another object of the present invention to provide a protective layer on the aluminum head drum surface which does not damage or adversely affect the integrity of the video tape and/or information recorded thereon.

It accordance with one embodiment of the present invention, there is provided an aluminum head drum with a protective layer coated thereon for use in a video cassette recorder(VCR) provided, characterized in that the protective layer comprises diamond-like carbon(DLC) in a thickness ranging from 0.3 $\mu$m to 2.0 $\mu$m and has a varying mechanical hardness, wherein the mechanical hardness has a maximum value at a region of the protective layer coming in contact with the aluminum head drum, decreases smoothly and continuously and reaches a minimum value at a region of the protective layer coming in contact with atmosphere.

BRIEF DESCRIPTION OF THE DRAWINGS

The above and other objects, and features of the present invention will become apparent from the following description of preferred embodiments given in conjunction with the accompanying drawings, wherein.

DETAILED DESCRIPTION OF THE PREFERRED EMBODIMENTS

Figure 1:
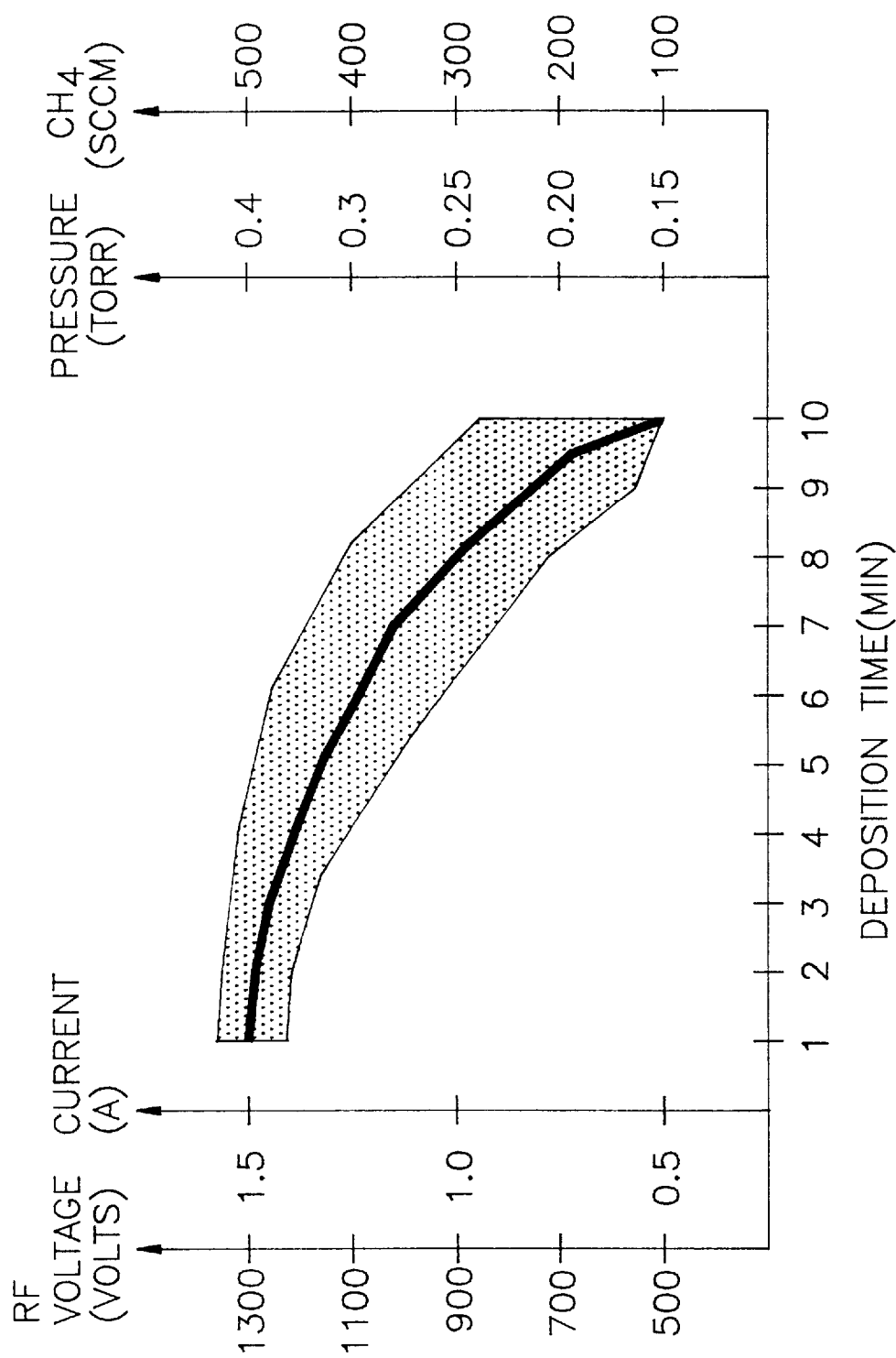
FIG. 1 presents the coating condition for forming a protective layer made of diamond-like carbon as a function of deposition time in accordance with one preferred embodiment of the present invention.

In accordance with the present invention, the surface of the aluminum head drum in a VCR is provided with a protective layer comprising diamond-like carbon.

As used herein, by diamond-like carbon(DLC), it is meant a three dimensional arrangement of carbon atoms having a short range order which is similar to the one observed in the diamond structure, wherein each carbon atom is surrounded by four other carbon atoms, but unlike the diamond structure, lacks a long range order, i.e., no unit of the structure is repeated at regular intervals; and possessing the dielectric, chemical, mechanical and optical properties that are shown in Table 1.

TABLE 1

Properties of diamond and diamond-like carbon

| | Diamond | DLC |
|---|---|---|
| Crystal Structure | Cubic ($sp^3$) | Amorphous Combination of $sp^3$, $sp^2$, $sp^1$ |
| Density (g/cm$^3$) | 3.51 | 1.8–2.0 |
| Hardness (Vicker's, kg/mm$^2$) | 7,000–10,000 | 900–3,000 |
| Friction coefficient | 0.03–0.07 | 0.005–0.05 |
| Refractive index | 2.42 | 1.8–2.2 |
| Transparency | UV-VIS-IR | VIS IR |
| Optical Gap (eV) | 5.5 | 2.0–3.0 |
| Resistivity (Ωcm) | >$10^{16}$ | $10^{10}$–$10^{13}$ |
| Dielectric constant | 5.7 | 4–9 |

As can be seen from Tables 2 and 3, the above mentioned protective layer material, i.e., DLC is harder than aluminum alloys, in addition to having a lower friction coefficient with respect to the video tape.

TABLE 2

Micro-Vicker's hardness of various materials (measurement depth is less than 0.5 μm).

| Material | Micro-Vicker's hardness (kg/mm$^2$) |
|---|---|
| AL | 16 |
| Al—Cu | ~100 |
| Al—Si | ~55 |
| γ-$Fe_2O_3$ | 560 |
| DLC | 2800 |
| polycrystalline $Al_2O_3$ | 1600–1800 |

TABLE 3

Friction coefficient of various materials

| Material | Friction coefficient* |
|---|---|
| $Al_2O_3$ | 0.35 |
| DLC | 0.25 |

*The friction coefficient for each material was calculated using the change in tape tension before and after rubbing the tape 80 times on the surface layered with the material.

The protective layer made of DLC is formed on the surface of the aluminum head drum using the technique of plasma-enhanced chemical vapor deposition (PECVD), the technique comprising the steps of:

(a) loading the aluminum head drum in a reactor including a die casted aluminum head drum holder, creating a high vacuum of at least $10^{-4}$ Torr and checking for any leaks; (b) initiating a flow of an inert gas, e.g., argon (Ar), and heating the reactor to a desired temperature, e.g., in the range of about 80° C. to 150° C. at about 0.07 to 0.4 Torr, and also pre-heating the aluminum head drum holder to the desired temperature, i.e., 80° C.–150° C.; (c) after the desired temperature has been reached, striking the plasma and applying a radio frequency(RF) power density of 0.04 mW/cm$^2$ to 2 W/cm$^2$ for 5 to 30 minutes to the aluminum head drum in the presence of the inert gas, e.g., Ar, in order to plasma clean the die casted aluminum head drum; (d) after the plasma cleaning, reducing the inert gas flow, and being flowing a gaseous feed mixture including methane; (e) forming a DLC layer on the aluminum head drum surface under a temperature of 120° C. to 200° C. and a RF power density of 0.5 W/cm$^2$ to 0.2 W/cm$^2$; (f) discontinuing the flow of the gaseous feed mixture, turning-off RF-power and cooling the aluminum head drum with the protective layer of DLC under the flow of the inert gas; and (g) recovering the aluminum head drum with the protective layer made of DLC for inspection and further testing.

Figure 2:
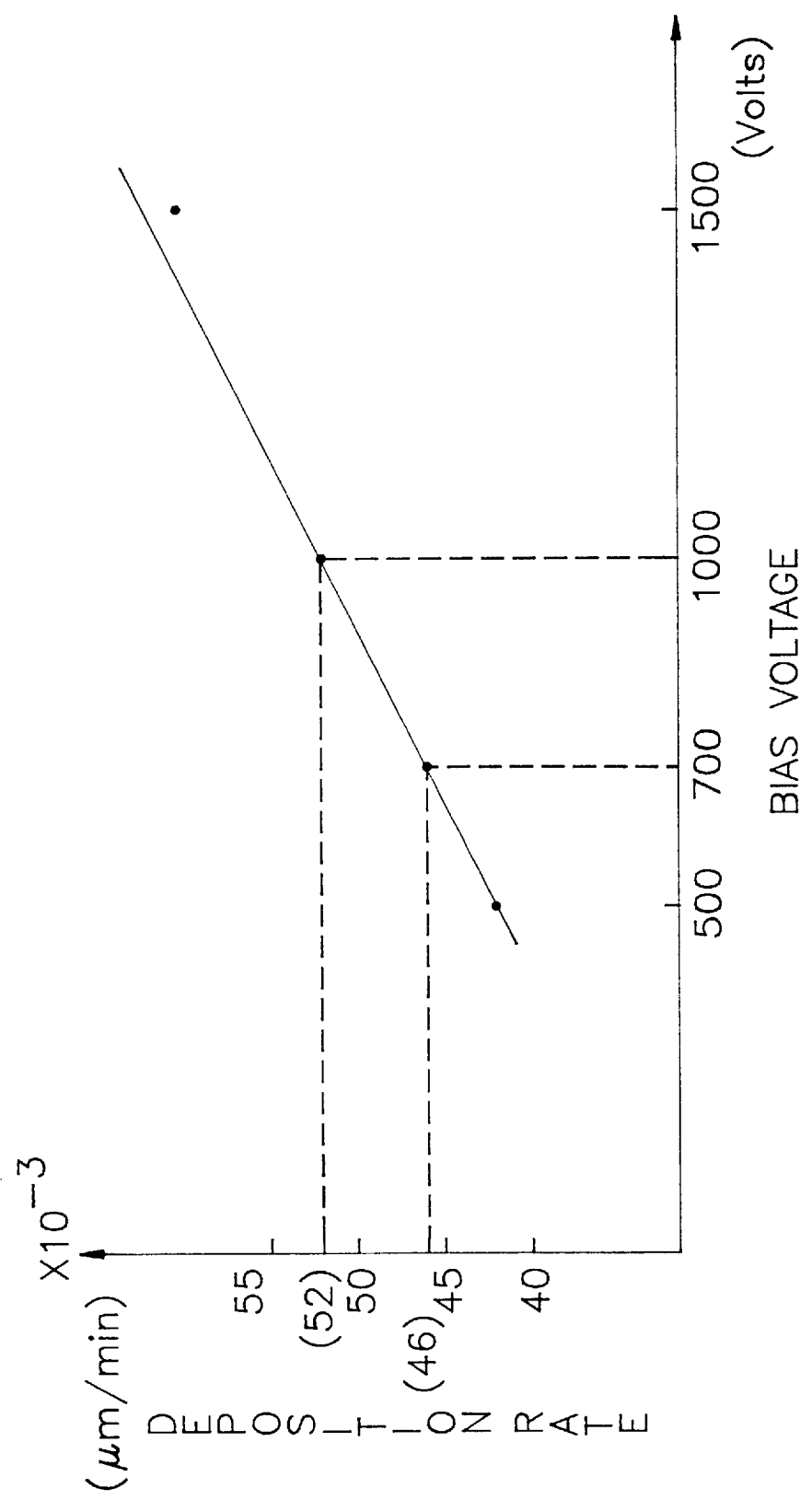
FIG. 2 illustrates the deposition rate for forming the protective layer made of diamond-like carbon as a function of bias voltage in accordance with one preferred embodiment of the present invention.
Figure 3:
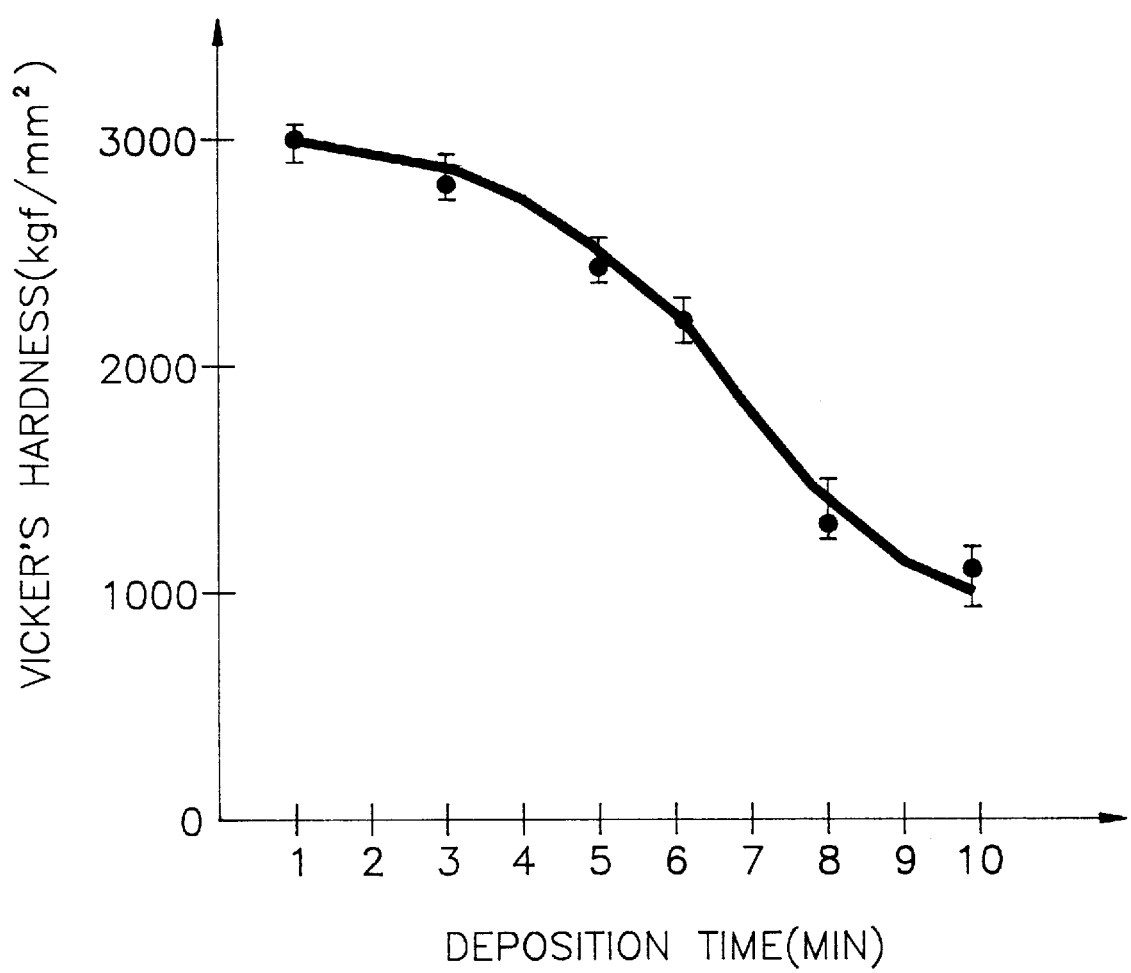
FIG. 3 is Micro-Vicker's hardness of the protective layer as a function of deposition time in accordance with one preferred embodiment of the present invention.
Figure 4:
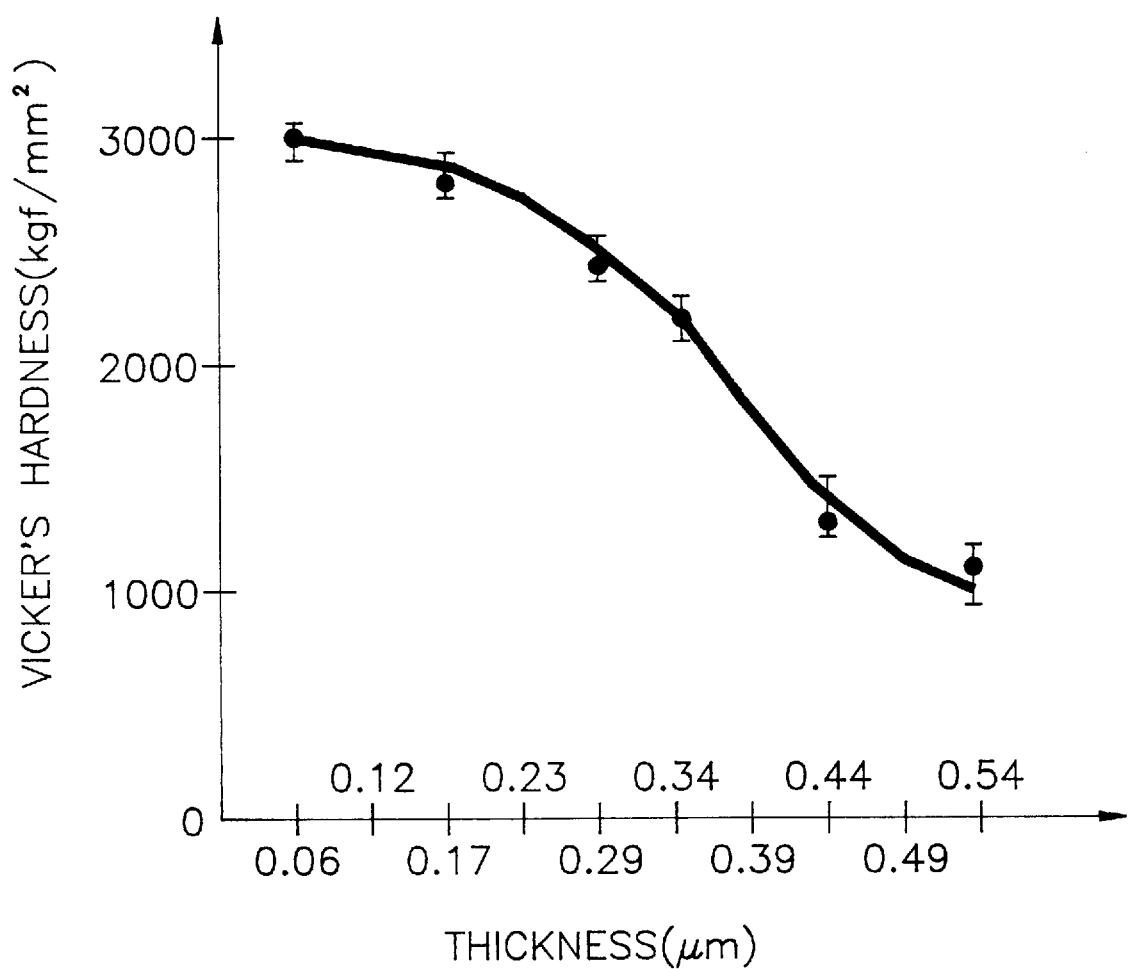
FIG. 4 offers Micro-Vicker's hardness of the protective layer made of diamond-like carbon as a function of layer thickness in accordance with one of preferred embodiment of the present invention.
Figure 5:
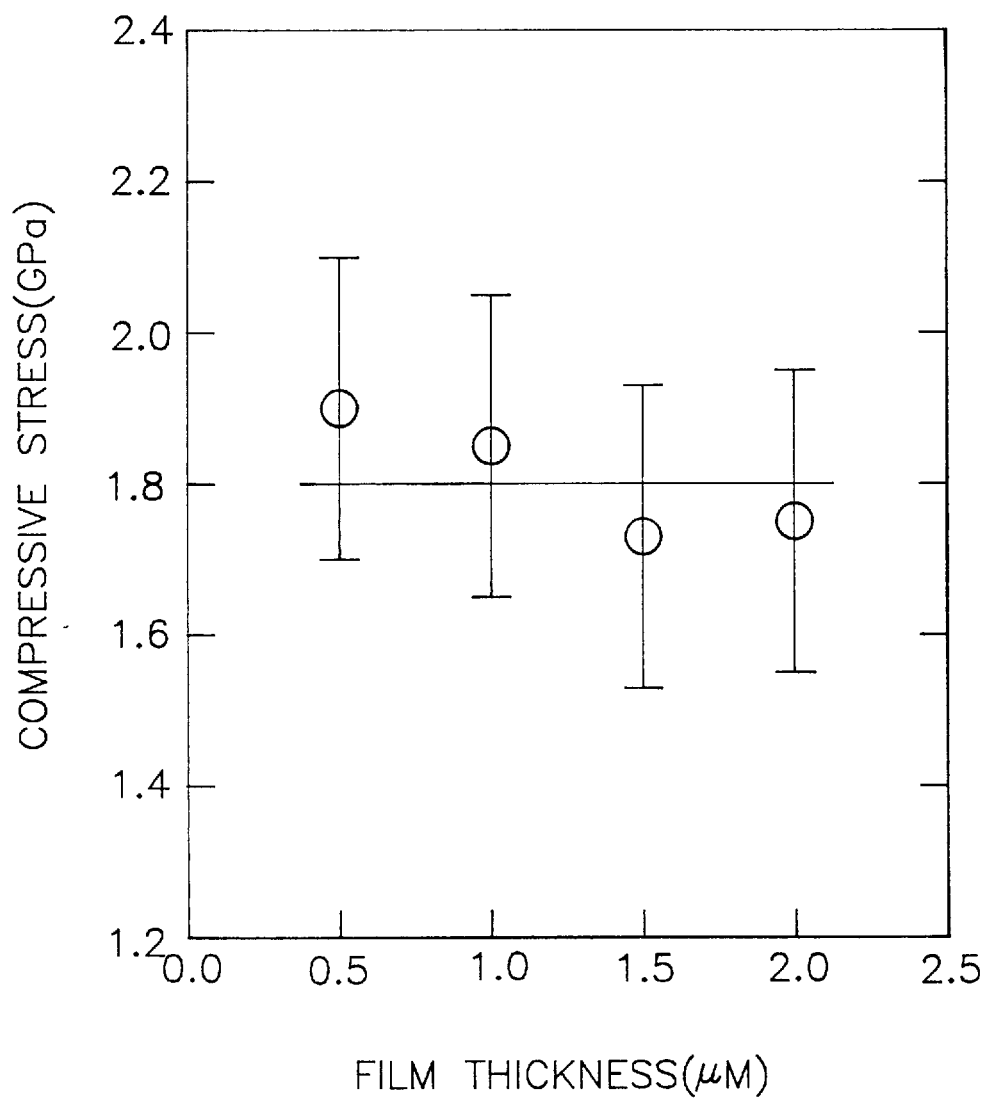
FIG. 5 shows the change in the compressive stress of the protective layer made of diamond like carbon as a function of layer thickness.

FIGS. 1, 2, 3 and 4 illustrated the coating condition of the protective layer of DLC as a function of deposition time, the deposition rate as a function of bias voltage, and Micro-Vicker's hardness of one particular protective layer of DLC as a function of deposition time and layer thickness obtained using the results shown in FIGS. 1 and 2, respectively, in accordance with one preferred embodiment of the present invention. As shown in FIGS. 3 and 4, aluminum head drum and Vicker's hardness thereof decreases with the deposition time and the layer thickness. The reason for this is that it requires a large amount of energy to bond DLC onto the aluminum head drum surface, resulting in a DLC coating which is extremely hard. However, once the initial coating of DLC is firmly established on the aluminum head drum surface, it requires less energy to form additional coating on top of the initial coating of DLC and hence the energy for forming additional coating decreases, which in turn decreases Micro-Vicker's hardness of the coating formed. Micro-Vicker's hardness of the DLC coating and the energy required for forming thereof is roughly proportional to each other. In forming the protective layer of DLC, the energy required for the formation thereof is smoothly and continuously decreased in order to alleviate the internal compressive stress until Micro-Vicker's hardness of the coating coming in contact with the magnetic substance on the tape is of roughly a same magnitude as that of the magnetic substance on the tape. If the compressive stress inside the protective layer become too great for it to handle, it may result in a surface cracking. In case of the protective layer of DLC. as shown in FIGS. 3 and 4, Micro-Vicker's hardness drops from 3,000 kg/mm$^2$ for the initial coating coming in contact with the aluminum head drum surface to 1,000 kg/mm$^2$ for the coating coming in contact with atmosphere by controlling the bias voltage with other conditions being held constant. Micro-Vicker's hardness of the DLC protective layer coming in direct contact with the video tape is 1.5 to 2.0 times that of the magnetic substance on the video tape under a deposition rate of $5 \times 10^{-3}$ μm/min which corresponds to a bias voltage of approximately 1,000 volts, as shown in FIG. 2, the protective layer made of DLC shown in FIG. 4 has a thickness of 0.5 μm.

When too thin, the mechanical properties of the protective layer will be influenced by the mechanical properties of the aluminum head drum which is essentially made of an aluminum alloy; and, in such a case, as seen in the case of $Al_2O_3$ layer, it would not be able to adequately protect the aluminum head drum surface. If it were too thick, the compressive stress inside the layer would become too great for it to handle, which, when faced with a variation in, e.g., temperature, may result in a surface cracking.

In the optimum thickness of the protective layer made DLC, the optimum thickness has been determined to lie within a range of 0.3–2.0 μm. The optimum thickness is represented by a region in which the compressive stress remains almost constant with respect to the layer thickness. It should be further noted that 0.3 μm is the minimum thickness of the DLC layer for imparting the required abrasion resistance on the aluminum head drum, and 2.0 μm is the maximum thickness of the DLC layer that con be coated on the aluminum head drum without physically and mechanically affecting the aluminum head drum. FIG. 4 shows the variation of the compressive stress of the protective layer made of DLC as a function of the layer thickness.

It should be further noted that, FIGS. 1, 2, 3 and 4 are coating condition vs deposition time, deposition rate vs bias voltage, and hardness vs deposition time and layer thickness for just one protective layer. It is possible to change the deposition process by changing the deposition conditions. For example, if the whole process is accelerated by a factor of, e.g., 10, by changing the deposition conditions, it is possible to obtain continuous and smooth curves showing variation in hardness as function of deposition time and thickness, the new curves having similar shape as the ones shown in FIGS. 1, 2, 3 and 4.

In order to determine the reliability of the aluminum head drum having a protective layer comprising DLC, the following tests were carried out:
(1) conducting and accelerated mode test consisting of consecutively operating a VCR in the modes of Fast Forward, Rewind, Fast Forward while viewing, and Rewind while viewing, all within a 30 second period wherein the Fast Forward mode lasts for 7 seconds, the Rewind mode, for 7 seconds, the Fast Forward while viewing, for 8 seconds, and the Rewind while viewing, for 8 seconds;
(2) conducting a normal operating test, i.e., operating the VCR in the Play mode; and
(3) conducting a humidity test by operating the VCR in the Play mode at 30° C. and 70% humidity.

The results obtained were compared with those obtained from similar tests carried out with a VCR having a conventional aluminum head drum.

The effects of the accelerated mode test and the normal operation test on the undulations provided on the head drum surface were observed using a roughness tester from KOSAKA(Surfcorder SE-300).

Figure 6A:
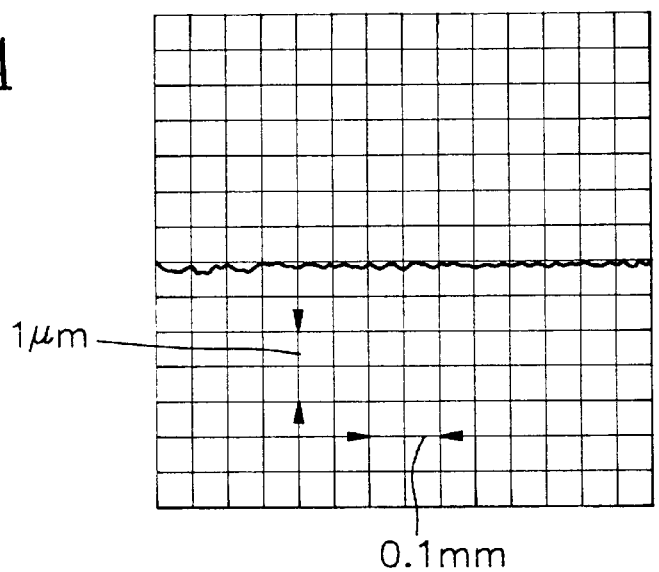
FIGS. 6A, 6B and 6C depict the surface roughness test data of a conventional aluminum head drum with a protective layer prior the reliability test, and same offer the accelerated reliability test and the normal reliability test, respectively.
Figure 6B:
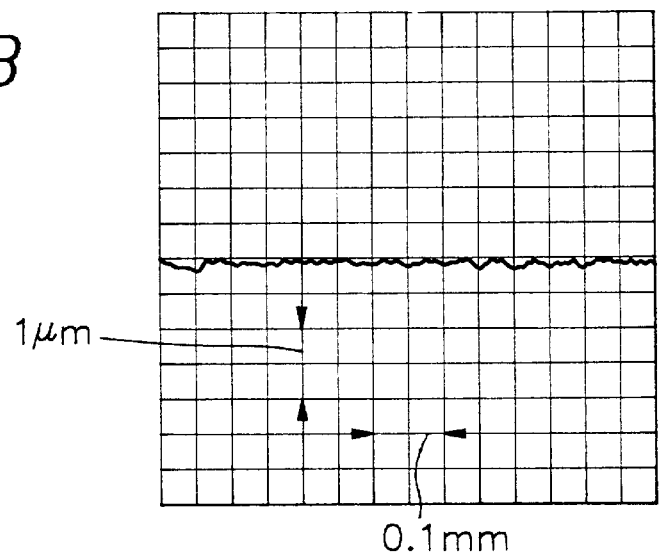
Figure 6C:
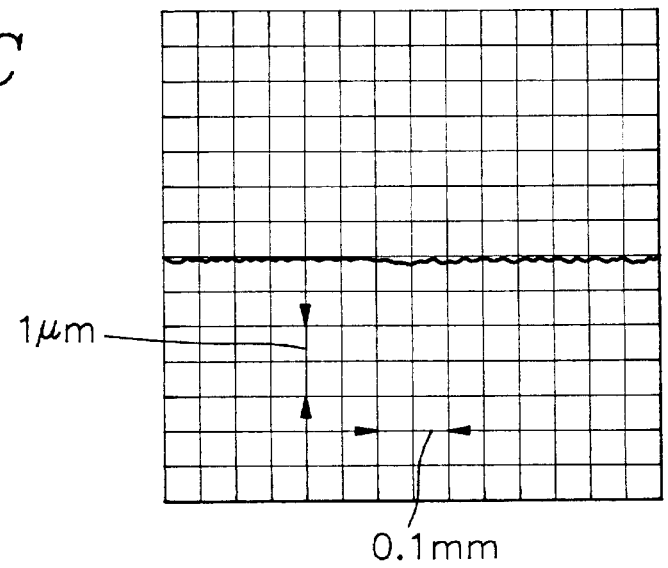

The reliability of a conventional aluminum head drum was evaluated in accordance with the above-mentioned reliability procedures, and the results are shown in FIGS. 6A, 6B and 6C. Specifically, in FIG. 6A, there is shown the roughness test data of the conventional aluminum head drum surface prior to the reliability tests; in FIG. 6B, the roughness data after 1,000 hours of the accelerated mode test; and in FIG. 6C, the same after 1,000 hours of the normal operating test.

Figure 7A:
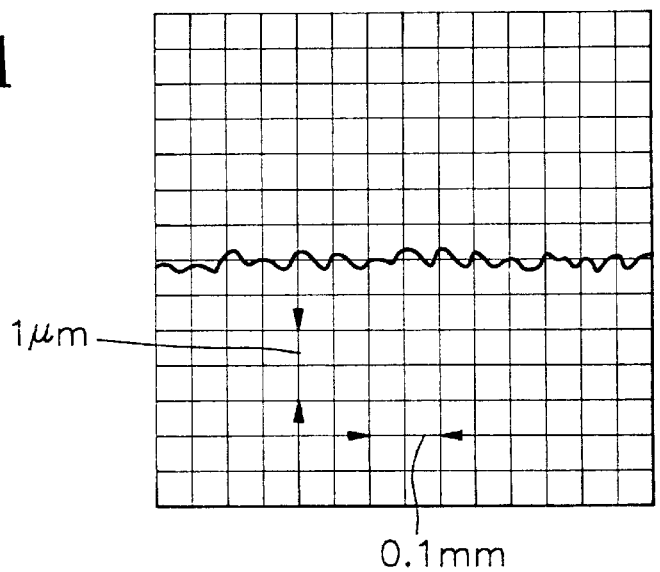
FIGS. 7A, 7B and 7C represent the surface roughness test data of the inventive aluminum head drum prior to the reliability test and same offer the accelerated mode test and the humidity test, respectively.
Figure 7B:
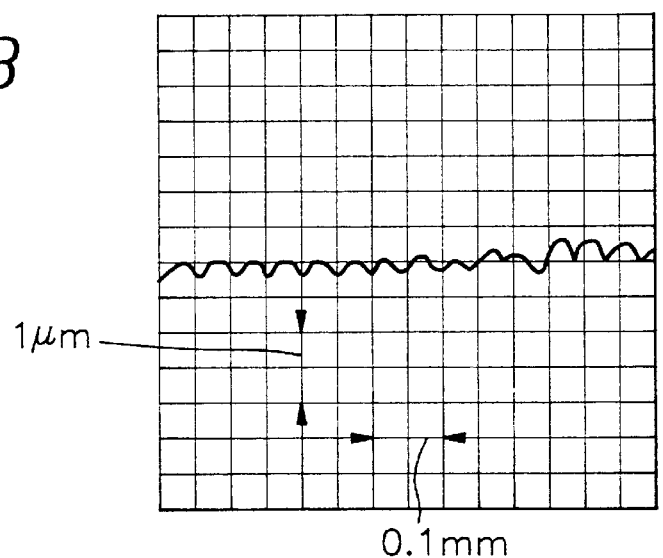
Figure 7C:
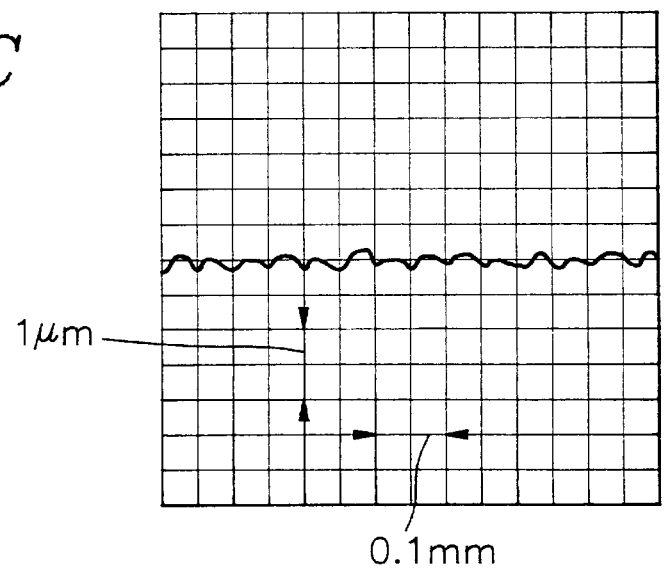

A protective layer made of DLC with a thickness of 2.0 μm was formed on the surface of an aluminum head drum using the PECVD method. The reliability of the aluminum head drum was evaluated in accordance with the above procedures, and the results are shown in FIGS. 7A, 7B and 7C. Specifically, in FIG. 7A, there is shown the roughness data of the aluminum head drum surface prior to the reliability tests; in FIG. 7B, the roughness data after 1,000 hours of the accelerated mode test; and, in FIG. 7C, the same after 1,000 hours of the humidity test.

According to the results obtained from the conventional aluminum head drum, in the cast of the accelerated mode test, the undulations provided on the aluminum head drum surface were almost worn out after 200 hours; and after 1,000 hours of continuous testing, they were completely gone and the aluminum drum surface was in the process of being lapped as shown in FIG. 6B. In the case of the normal operating test, the undulations all disappeared from the head aluminum drum surface after 1,000 hours of continuous testing as shown in FIG. 6C. According to the results obtained from the humidity test, when observed after 1,000 hours of testing, the surface was covered with a binder-like substance (not shown), resulting in the disappearance of the undulations from the aluminum head drum surface. The binder-like substance, which was determined to have originated from the video tape, resulted from the increase in friction between the video tape and the head drum surface under the high humidity condition. It was also observed that there was a sudden stoppage, resulting from an increase in tape tension due to the increase in friction between the tape and the aluminum head drum surface under the high humidity condition.

According to the results obtained from the accelerated mode test and the humidity test conducted on the aluminum head drum with the DLC protective layer, even after 1,000 hours of testing, the undulations continued to maintain their initial form(see FIGS. 7B and 7C)

While the present invention has been shown and described with reference to the particular embodiments, it will be apparent to those skilled in the art that many changes and modifications may be made without departing from the spirit and scope of the invention as defined in the appended claims.

What is claimed is:

1. A video cassette recorder(VCR) incorporating therein an aluminum head drum being provided with a protective layer coated thereon, the video cassette recorder being characterized in that: the protective layer on the aluminum head drum comprises diamond-like carbon(DLC) in a thickness ranging from 0.3 $\mu$m to 2.0 $\mu$m and has a varying mechanical hardness, wherein the mechanical hardness has a maximum value at a region of the protective layer coming in contact with the aluminum head drum, decreases smoothly and continuously, and reaches a minimum value at a region of the protective layer coming in contact with atmosphere.

2. The video cassette recorder of claim 1, wherein Micro-Vicker's hardness of the region of the protective layer of the aluminum head drum coming in contact with a video tape is 1.5–2.0 times that of magnetic substances constituting the video tape.

3. An aluminum head drum provided with a protective layer coated thereon, characterized in that the protective layer comprises diamond-like carbon(DLC) in a thickness ranging 0.3 $\mu$m to 2.0 $\mu$m and has a varying mechanical hardness having a maximum value at the protective layer coming in contact with the aluminum head drum, decreases smoothly and continuously, and reaches a minimum value at a region of the protective layer coming in contact with atmosphere.

4. The aluminum head drum of claim 1, wherein Micro-Vicker's hardness of the region of the protective layer coming in contact with a video tape is 1.5–2.0 times that of magnetic substances constituting the video tape.

* * * * *

UNITED STATES PATENT AND TRADEMARK OFFICE
CERTIFICATE OF CORRECTION

PATENT NO. : 5,883,769

DATED : March 16, 1999

INVENTOR(S) : Kye-Chul Choi, et al.

It is certified that error appears in the above-identified patent and that said Letters Patent is hereby corrected as shown below:

Column 1, line 7, after "U. S." insert --application--.

Column 1, line 8, delete "on" and after "1995" insert --, now abandoned, which is a continuation-in-part of U. S. Application No. 08/220,798, abandoned.--.

Signed and Sealed this

Twenty-ninth Day of June, 1999

*Attest:*

Q. TODD DICKINSON

*Attesting Officer*  Acting Commissioner of Patents and Trademarks